United States Patent
Dong et al.

(10) Patent No.: US 6,778,395 B1
(45) Date of Patent: Aug. 17, 2004

(54) HEAT SINK CLIP

(75) Inventors: Shun Chi Dong, Austin, TX (US); Chung Yuan AHuang, Austin, TX (US); Yeu-Lih Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 124 days.

(21) Appl. No.: 10/360,265

(22) Filed: Feb. 7, 2003

(51) Int. Cl.[7] .............................................. H05K 7/20
(52) U.S. Cl. ...................... 361/704; 361/719; 165/80.3; 174/16.3; 257/718; 257/719; 257/727
(58) Field of Search ................................ 361/704, 719; 257/718, 719, 727; 165/80.3; 174/16.3; 24/458

(56) References Cited

U.S. PATENT DOCUMENTS

| | | | | |
|---|---|---|---|---|
| 5,542,468 A | * | 8/1996 | Lin .......................... | 165/80.3 |
| 5,638,258 A | | 6/1997 | Lin | |
| 5,668,348 A | * | 9/1997 | Lin .......................... | 174/16.3 |
| 5,771,960 A | * | 6/1998 | Lin .......................... | 165/80.3 |
| 5,860,195 A | * | 1/1999 | Wang ......................... | 24/459 |
| 5,933,326 A | * | 8/1999 | Lee et al. ................... | 361/704 |
| 5,953,212 A | * | 9/1999 | Lee .......................... | 361/709 |
| 6,318,452 B1 | * | 11/2001 | Lee .......................... | 165/80.3 |
| 6,456,493 B1 | * | 9/2002 | Lee .......................... | 361/704 |

* cited by examiner

Primary Examiner—Boris Chervinsky
(74) Attorney, Agent, or Firm—Wei Te Chung

(57) ABSTRACT

A heat sink clip (10) includes a pressing section (11) and first and second spring sections (12, 14). A first arm (15) depends from the first spring section. An operation lever (24) defines a pair of second pivot holes (244) and a pair of third pivot holes (246) at one end. The third pivot holes are closer to said one end of the lever. A connecting portion (20) has one end pivotably connected to the second spring section, and the other end pivotably connected at the third pivot holes of the lever. A second arm (25) is pivotably connected to the second pivot holes. The first and second arms define slots (18, 28) to engagingly receive posts (82) of a back plate (80). When the lever is rotated downwardly, the second arm of the clip is raised, and a heat sink (30) is thereby secured to a CPU (60).

22 Claims, 3 Drawing Sheets

HEAT SINK CLIP

BACKGROUND OF THE INVENTION

1. Field of the Invention

The present invention relates to securing of heat sinks to electronic devices, and particularly to heat sink clips having handles for facilitating operation.

2. Related Art

Advances in microelectronics technology have resulted in electronic devices which process signals and data at unprecedented high speeds. During operation of many contemporary electronic devices such as central processing units (CPUs), large amounts of heat are produced. The heat must be efficiently removed, to prevent the system from becoming unstable or being damaged. Heat sinks are frequently used to dissipate heat from these electronic devices.

Typically, a heat sink is attached to an electronic device such as a central processing unit (CPU) by a clip. The clip is usually integrally formed from a sheet of plastic or steel. An example of this kind of heat sink clip is disclosed in U.S. Pat. No. 6,343,015. The clip is relatively rigid, and a tool must be used to detach the clip from a corresponding socket. However, it is inconvenient to assemble/disassemble a heat sink using a tool, especially within the limited confines of a normal computer case. This slows attachment/detachment of the heat sink, and results in inefficiency in mass production facilities. Furthermore, the tool can easily skid off the clip during attachment/detachment of the heat sink, causing damage to adjacent components in the computer system.

Thus, an improved heat sink clip which overcomes the above problems is desired.

BRIEF SUMMARY OF THE INVENTION

Accordingly, an object of the present invention is to provide a heat sink clip for readily and securely attaching a heat sink to an electronic device, and for readily detaching the heat sink therefrom.

Another object of the present invention is to provide a clip assembly with handles for facilitating manual operation thereof.

To achieve the above-mentioned objects, a clip of the present invention for attaching a heat sink to a CPU mounted on a PCB comprises a pressing section and first and second spring sections. A first arm depends from the first spring section. An operation lever defines a pair of second pivot holes and a pair of third pivot holes. The third pivot holes are closer to one end of the operation lever. A connecting portion has one end pivotably connected to the second spring section, and the other end pivotably connected at the third pivot holes of the operation lever. A second arm is pivotably connected at the second pivot holes. The first and second arms define slots to engage with posts of a back plate. When the lever is rotated downwardly, the second arm of the clip is raised, and the heat sink is thereby securely attached to the CPU.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
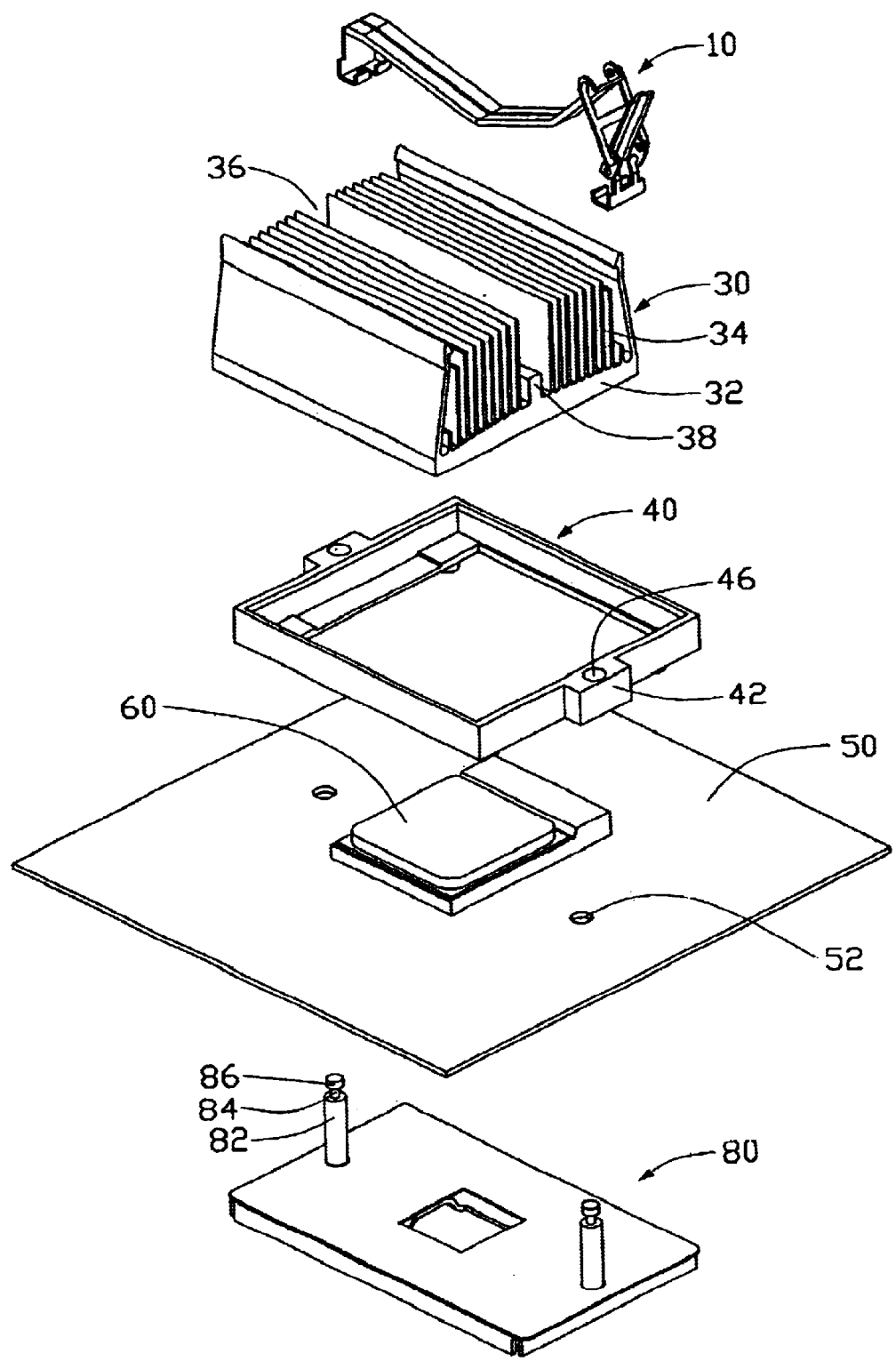
FIG. 1 is an exploded view of a heat sink clip in accordance with the present invention, used in conjunction with a back plate to press a heat sink onto a central processing unit (CPU) mounted on a printed circuit board (PCB)
Figure 2:
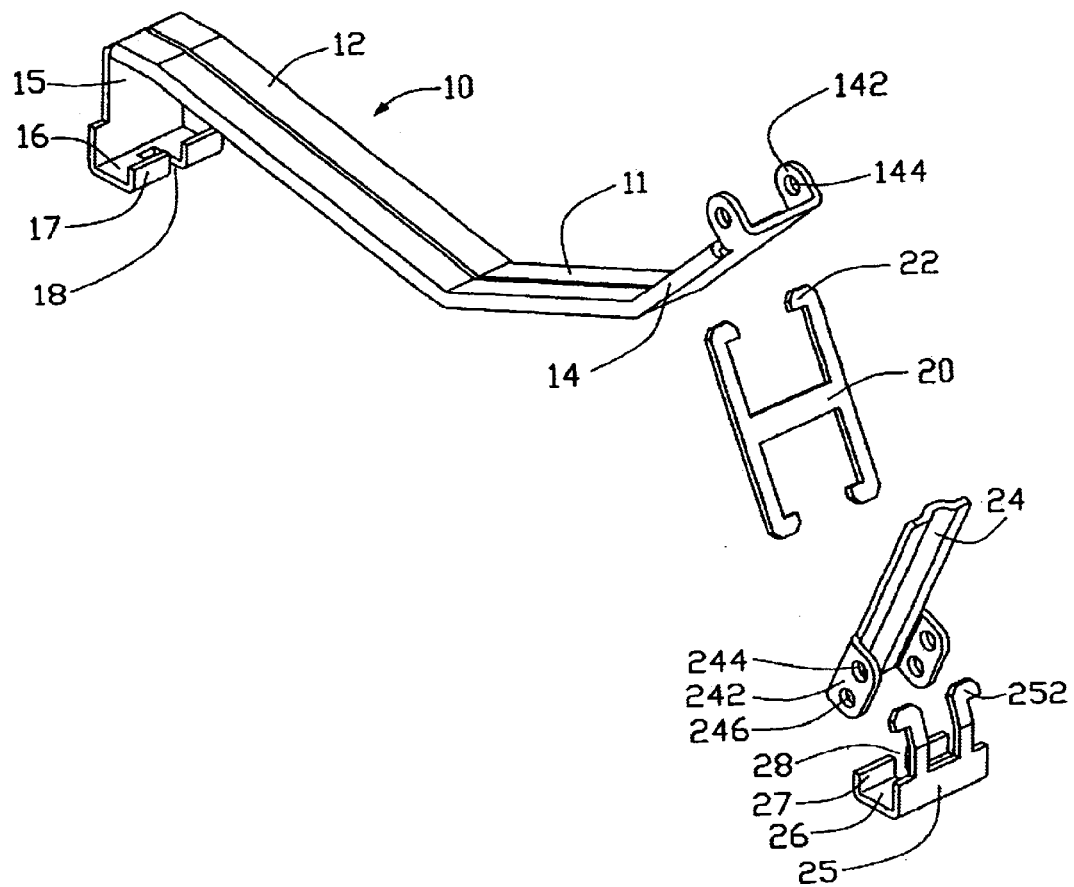
FIG. 2 is an isometric view of the heat sink clip of FIG. 1.

Referring to FIGS. 1 and 2, a heat sink clip 10 in accordance with the present invention is, used in conjunction with a back plate 80 to press a heat sink 30 onto a CPU 60 mounted on a PCB 50.

The heat sink 30 comprises a base 32, and a plurality of parallel fins 34 extending upwardly from the base 32. A channel 36 is defined in a center of the heat sink 30. A ridge 38 is defined on the base 32 of the heat sink 30 inside the channel 36. The ridge 38 is parallel with the fins 34 and lower than the fins 34. Two through holes 52 are defined in the PCB 50 at opposite sides of the CPU 60.

A retention frame 40 is attached to the PCB 50 around the CPU 60. The retention frame 40 is rectangular, and has a pair of blocks 42 formed at opposite sides thereof. A vertical bore 46 is defined in each block 42, corresponding to a respective one of the first through holes 52 of the PCB 50.

Two posts 82 extend upwardly from opposite sides of the back plate 80. Each post 82 comprises a locking head 86 at an upper end thereof, and an annular groove 84 defined below the locking head 86. A diameter of each post 82 is slightly less than a diameter of each through hole 52 of the PCB 50 and each bore 42 of the retention frame 40.

The clip 10 comprises a pressing section 11, and first and second spring sections 12, 14 extending outwardly and upwardly from opposite ends of the pressing section 11 respectively. Each of opposite lateral side edge portions of the pressing section 11 and the first and second spring sections 12, 14 is folded back over itself to form an overlapped configuration for reinforcing. A first arm 15 depends from a distal end of the first spring section 12. A first supporting plate 16 extends horizontally and inwardly from a bottom end of the first arm 15, and then extends upwardly to form a first blocking plate 17. A first slot 18 is defined in the first blocking plate 17 and the first supporting plate 16.

Two first tabs 142 are upwardly formed at opposite side edges of a free end of the second spring section 14. A first pivot hole 144 is defined in each first tab 142. An operation lever 24 has two second tabs 242 at opposite side edges of one end thereof. Second and third pivot holes 244, 246 are defined in each second tab 242. The third pivot holes 246 are closer to the one end of the operation lever 24.

An H-shaped connecting portion 20 has four hooks 22 respectively inwardly formed from four corners thereof. Two of the hooks 22 engage in the first pivot holes 144 of the second spring portion 14, while the other two hooks 22 engage in the second pivot holes 244 of the operation lever 24.

A second arm 25 has two catches 252 extending upwardly and then outwardly to pivotably engage in the third pivot holes 246 of the operation lever 24, whereby the clip 10 is assembled together. A second supporting plate 26 extends horizontally and inwardly from a bottom end of the second arm 25, and then further extends upwardly to form a second blocking plate 27. A second slot 28 is defined in the second blocking plate 17 and the second supporting plate 16. Widths of the first and second slots 18, 28 are each slightly greater than a diameter of either of the posts 82 at the grooves 84.

Figure 3:
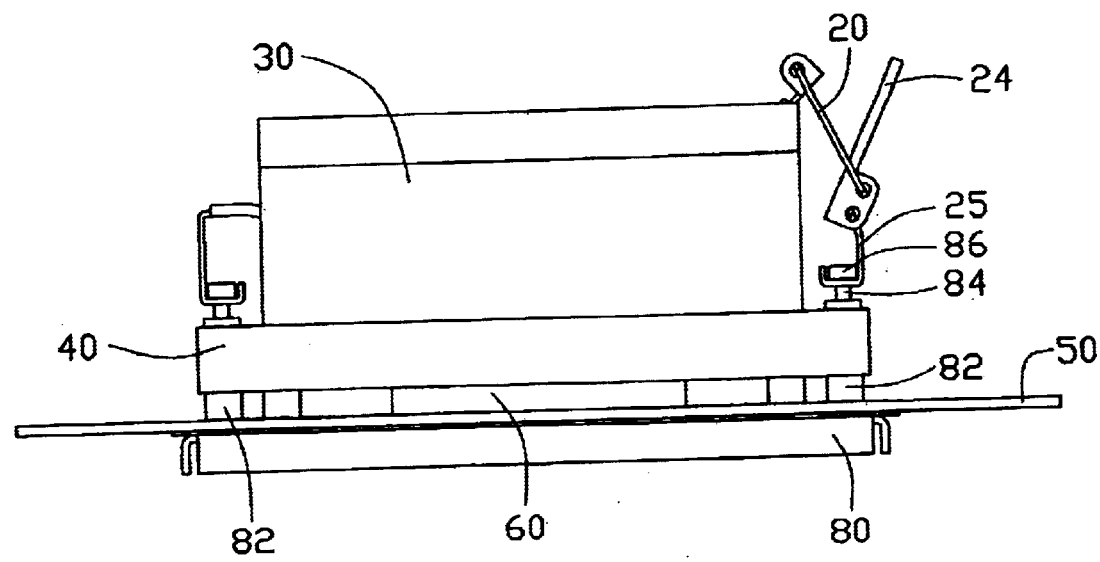
FIG. 3 is an assembled view of FIG. 1.

Referring to FIG. 3, in operation, the heat sink 30 is placed onto the CPU 60. The clip 10 is disposed in the channel 36 of the heat sink 30 and supported by the ridge 38 of the heat sink 30, with the first and second supporting plates 16, 26 corresponding to the blocks 42 of the retention frame 40. The back plate 80 is placed against a bottom surface of the PCB 50. The posts 82 are successively extended through the through holes 52 of the PCB 50, and the bores 42 of the retention frame 40. The posts 82 enter the corresponding first and second slots 18, 28 at the annular grooves 84, wherein the axial dimension of the groove 84 of the post 82 is not less than the vertical dimension of the slot 18 in the first blocking plate 17 so as to allow lateral movement of the post 82 around the groove 84 through the slot 18 in the blocking plate 17.

Figure 4:
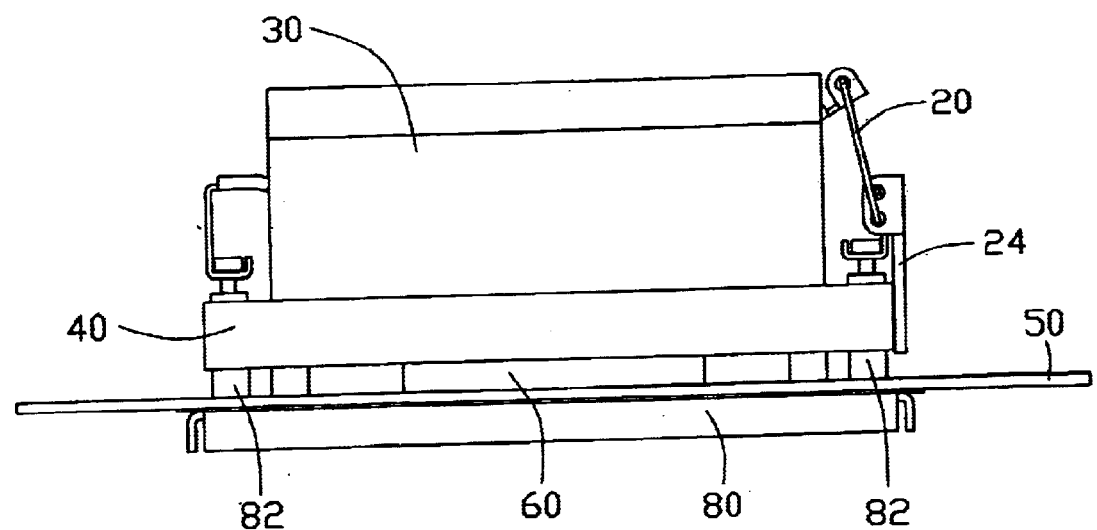
FIG. 4 is an assembled view of FIG. 1 wherein the operation lever is rotated downwardly in a locked position.

Referring also to FIG. 4, the operation lever 24 is rotated downwardly so that a free end of the operation lever 24 is positioned alongside the retention frame 40. The pressing section 11 of the clip 10 presses the heat sink 30, and causes both the first and second supporting plates 16, 26 to be resiliently raised. The locking heads 86 of the posts 82 abut against the supporting plates 16, 26 and the blocking plates 18, 28 of the clip 10, whereby the posts 82 are prevented from escaping from the clip 10. In this locked position, the operation lever 24 bears a clockwise force. This ensures that the operation lever 24 remains stably in position.

Removal of the clip 10 is essentially a reverse of the above-described procedure. The operation lever 24 is rotated upwardly to release the engagement between the clip 10 and the posts 82 of the back plate 80. The clip 10 is then easily taken out.

In the present embodiment, the clip 10, the connecting portion 20, the operation lever 24 and the second locking arm 25 constitute a four-piece clip assembly which allows the whole clip assembly to be operated easily and friendly in comparison with the conventional two or three pieces clip assembly due to the connecting portion 20 pivotal relative to the clip 10.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink clip for attaching a heat sink to an electronic package that is mounted on a circuit board, comprising:
   a pressing section adapted to press the heat sink; and
   two spring sections extending inclinedly upwardly from opposite ends of the pressing portion;
   a first locking portion depending from one of the spring sections;
   a connecting portion pivotably connected to the other one of the spring sections;
   an operation lever having spaced first and second pivot means in the vicinity of one end of the operation lever, the second pivot means closer to the end of the operation lever, the operation lever pivotably connected to the connecting portion at the first pivot means; and
   a second locking portion pivotably connected to the second pivot means of the operation lever, wherein when the operation lever rotates downwardly, the first and second locking portions are raised, thereby securing the heat sink to the electronic device.

2. The heat sink clip as described in claim 1, wherein opposite lateral side edge portions of the pressing section and the spring sections are overlapped for reinforcing.

3. The heat sink clip as described in claim 1, wherein each of the first and second locking portions is inwardly bent to form a supporting plate, and a blocking plate upwardly formed from an inner end of the first supporting plate, a slot is defined in the blocking plate and a part of the supporting plate adapted for engagingly receiving a corresponding post extending from the circuit board.

4. The heat sink clip as described in claim 1, wherein two tabs are formed at a free end of said other one of the spring sections, and a pivot hole is defined in each tab.

5. The heat sink clip as described in claim 4, wherein the connecting portion is generally H-shaped, and comprises two pairs of inwardly formed hooks at four corners thereof, the upper pair engaging in the pivot holes of said other one of the spring sections, and the lower pair engaging in the first pivot means of the operation lever.

6. The heat sink clip as described in claim 1, wherein the second locking portion has two catches to pivotably engage with the second pivot means of the operation lever.

7. The heat sink clip as described in claim 1, wherein two plates are bent from opposite sides of one end of the operation lever, two pairs of pivot apertures are defined in the plates, thereby forming the first and second pivot means.

8. A heat sink assembly comprising:
   a circuit board defining two spaced through holes therein;
   an electronic package mounted on the circuit board;
   a heat sink attached onto the electronic package, the heat sink having a base and a plurality of fins extending upwardly from the base;
   a back plate attached to a bottom face of the circuit board, the back plate comprising two posts extending therefrom corresponding to the through holes of the circuit board, a groove defined in an upper end of each of the posts;
   a clip attaching the heat sink to the electronic package, the clip comprising a pressing section, a first spring arm depending from one end of the pressing section, a connecting portion pivotably attached to the other end of the pressing section, an operation lever pivotably attaching a second spring arm to the connecting portion, wherein
   the first and second spring arms each further extend inwardly and then upwardly to form a supporting plate and a blocking plate, and a slot is defined in the supporting plate and the blocking plate for engagingly receiving a corresponding post of the back plate at the groove, and
   when rotating the operation lever, the second spring arm is raised, and the heat sink is thereby secured to the electronic package.

9. The heat sink assembly as described in claim 8, wherein the operation lever has first and second pivot means in the vicinity of one end thereof, and the second pivot means is closer to said one end of the operation lever.

10. The heat sink assembly as described in claim 9, wherein one end of the connecting portion is pivotably connected to said other end of the pressing portion, and the other end of the connecting portion is pivotably connected to the first pivot means of the operation lever.

11. The heat sink assembly as described in claim 10, wherein the second spring arm is pivotably attached to the second pivot means of the operation lever.

12. The heat sink assembly as described in claim 9, wherein the first and second pivot means of the operation lever respectively comprise holes.

13. The heat sink assembly as described in claim 8, wherein an axial dimension of the groove of each of the posts is no less than a vertical height of the slot at each of the blocking plates.

14. The heat sink assembly as described in claim 8, wherein a channel is defined in the heat sink, and a ridge is formed in the channel for supporting the pressing portion of the clip.

15. The heat sink assembly as described in claim 8, further comprising a retention frame attached to the circuit board around the electronic package, wherein two bores are defined in opposite sides of the retention frame corresponding to the through holes of the retention module.

16. A heat sink assembly comprising:
   a heat sink located above a printed circuit board;
   a clip assembly retaining the heat sink relative to the printed circuit board in a stable manner, said clip assembly including:
      a clip defining an elongated resilient pressing section urging the heat sink toward the printed circuit board;
      a connecting portion defining opposite first and second regions with the first region pivotally mounted to one end of the clip;
      an operation lever defining opposite first and second sections with the first section pivotally mounted to the second region of the connecting portion; and
      a locking arm defining opposite pivot region and locking region with the pivot region pivotally mounted to the second section of the operation lever; wherein
      when said heat sink is not retained in the stable manner by said clip assembly, said clip assembly is in a loosened stretched status; when said heat sink is retained in the stable manner by the said clip assembly, said clip assembly is in a tensioned retracted status with at least two of said connecting portion, the operation lever and the locking arm at least partially overlapping with each other.

17. The assembly as described in claim 16, wherein said clip, said connecting portion, said operation lever and said locking arm are pivotally linked with one another sequentially along a lengthwise direction of the resilient pressing section of the clip.

18. The assembly as described in claim 16, wherein said heat sink defines a recessed area which the resilient pressing section is seated on.

19. The assembly as described in claim 16, wherein said connecting portion, said operation lever and said locking arm are substantially located by one side of the heat sink.

20. The assembly as described in claim 16, wherein said locking arm is engaged with a post extending from a back plate located on an underside of the printed circuit board.

21. A four-piece clip assembly for use with a heat sink, comprising:
   a clip defining an elongated resilient pressing section;
   a connecting portion defining opposite first and second regions with the first region pivotally mounted to one end of the clip;
   an operation lever defining opposite first and second sections with the first section pivotally mounted to the second region of the connecting portion; and
   a locking arm defining opposite pivot region and locking region with the pivot region pivotally mounted to the second section of the operation lever; wherein
      said clip, said connecting portion, said operation lever and said locking arm are pivotally linked with one another sequentially along a lengthwise direction of the resilient pressing section of the clip.

22. The assembly as described in claim 21, wherein at lest two of said connecting portion, the operation lever and the locking arm are configured to partially comply with each other so as to at least partially and compliantly overlap each other when said clip assembly is in a tension status to urge the heat sink.

* * * * *